United States Patent [19]
Yoshida et al.

[11] 4,256,513
[45] Mar. 17, 1981

[54] PHOTOELECTRIC CONVERSION DEVICE

[75] Inventors: Manabu Yoshida, Katano; Jun Fukuchi; Shigetoshi Takayanagi, both of Kyoto, all of Japan

[73] Assignee: Matsushita Electric Industrial Co., Ltd., Kadoma, Japan

[21] Appl. No.: 85,205

[22] Filed: Oct. 16, 1979

[30] Foreign Application Priority Data

Oct. 19, 1978 [JP] Japan .................. 53-129116
Oct. 19, 1978 [JP] Japan .................. 53-129131
Oct. 20, 1978 [JP] Japan .................. 53-129625
Feb. 2, 1979 [JP] Japan .................. 54-11685

[51] Int. Cl.$^3$ .................................. H01L 31/00
[52] U.S. Cl. ............................ 136/256; 106/1.14; 106/1.19; 106/1.26; 252/514; 357/30; 357/67; 427/88
[58] Field of Search ............... 136/89 CC; 357/30, 67; 252/514; 427/88; 106/1.14, 1.19, 1.26

[56] References Cited

U.S. PATENT DOCUMENTS

| 4,153,907 | 5/1979 | Kofron .................. 357/30 |
| 4,163,678 | 8/1979 | Bube .................. 136/89 CC |
| 4,165,241 | 8/1979 | Yerkes et al. .................. 136/89 CC |

OTHER PUBLICATIONS

E. L. Ralph, "Recent Advances in Low Cost Solar Cell Processing", *Cont. Record, 11th IEEE Photovoltaic Specialists' Conf.* (1975), pp. 315–316.
M. B. Field et al., "Application of Thick-Film Technology to Solar Cell Fabrication", *Conf. Record, 12th IEEE Photovoltaic Specialists Conf.* (1976), pp. 303–308.
A. D. Haigh, "Fired Through Printed Contacts on Antireflection Coated Silicon Terrestrial Solar Cells", *Conf. Record, 12th IEEE Photovoltaic Specialists Conf.* (1976), pp. 360–361.
L. Frisson et al., "Screen Printed Contacts on Silica Solar Cells with Low Series Resistance", *Conf. Record, 13th IEEE Photovoltaic Specialists Conf.* (1978), pp. 590–592.

*Primary Examiner*—Aaron Weisstuch
*Attorney, Agent, or Firm*—Stevens, Davis, Miller & Mosher

[57] ABSTRACT

A photoelectric conversion device such as a solar cell in which electrodes formed from a conductive paste make ohmic contact with the surfaces of impurity diffused layers respectively formed in a semiconductor substrate. The conductive paste contains ultrafine particles of silver and gold as its principal solid components. The conductive paste further contains, as its additional principal solid components, ultrafine particles of a metal having a eutectic temperature lower than that of silver when alloyed with the semiconductor and a powdery glass material not containing any lead oxide glass component. The electrodes provided by the conductive paste exhibit excellent electrical properties when the conductive paste is subjected to firing treatment at a temperature of about 600° C. Thus, when, for example, the semiconductor substrate is of n-type silicon and a p$^+$-type diffused layer is formed in one of its major surfaces to form a p$^+$/n junction of relatively small depth, the electrode making ohmic contact with the p$^+$-type diffused layer does not penetrate through the p$^+$/n junction and has a low contact resistance. The photoelectric conversion device such as the solar cell thus obtained can operate with a higher conversion efficiency than hitherto and can be manufactured at a lower cost than hitherto.

5 Claims, 7 Drawing Figures

PHOTOELECTRIC CONVERSION DEVICE

BACKGROUND OF THE INVENTION

This invention relates generally to photoelectric conversion devices, and more particularly to a photoelectric conversion device such as a solar cell in which its electrodes are formed by printing an electrode composition on a semiconductor substrate so that a photoelectric conversion device such as a solar cell having a high conversion efficiency can be easily manufactured at a low cost.

The screen printing technique has become more and more popular as an inexpensive and effective means for forming electrodes of a solar cell. According to this screen printing technique, a viscous slurry (which will be referred to hereinafter as a conductive paste) prepared by mixing a metal or metals in powder form with a powdery vitreous or glass material and dispersing the mixture in an organic solvent is printed by a stencil screen on a semiconductor substrate which is to be formed with the electrodes, and is then subjected to firing treatment at a suitable temperature to provide the desired electrodes. Such a screen printing technique is generally employed for the manufacture of a semiconductor device such as a thick-film IC device in which resistors, capacitors and other circuit elements are integrated to provide an integrated circuit configuration.

Application of this screen printing technique to the formation of the electrodes of the solar cell is advantageous over the conventional vacuum evaporation technique and plating technique in that the step of formation of the electrodes can be greatly improved so that the process for the manufacture of the solar cell can be greatly simplified and can also be automated for mass production.

The reduction in the manufacturing cost of solar cells is one of the most important subjects at present and is the critical or determinative factor for the extensive use of solar cells. It is acknowledged in this connection that the step of formation of the electrodes occupies a large proportion of the cost required for the manufacture of the solar cells, and improvement of this step is now strongly demanded. From this standpoint, the aforementioned screen printing technique is most suitable for the desired reduction in the solar cell manufacturing cost.

In the application of this screen printing technique to the formation of the electrodes of a solar cell comprising a photovoltaic semiconductor substrate of silicon, there are the important requirements that each of the electrodes formed by screen printing exhibit a low contact resistance between it and the semiconductor substrate and be firmly deposited on the semiconductor substrate and that the electrode material deposited on a diffused layer having a conductivity type different from or opposite to that of the semiconductor substrate should not penetrate through this diffused layer.

It has been reported that a conductive paste of silver (Ag) commonly used hitherto for the formation of electrodes of resistors, capacitors, etc. by screen printing and subsequent firing treatment is also used for the formation of the electrodes of the solar cell of the kind above described. It has also been proposed that a conductive paste of silver/palladium (Ag/Pd) or gold (Au) commonly used hitherto as the electrode material for resistors and capacitors can also be used for the above purpose. The conductive paste of Ag or Ag/Pd contains Ag in powder form or a mixture of Ag and Pd in powder form, a powdery low-melting glass composition containing glass of the lead oxide (PbO) system as its principal component, or powdery borosilicate-lead glass, an organic binder such as ethyl cellulose, and an organic solvent such as cellosolve added to the above composition to adjust the viscosity of the conductive paste which is applied in the form of a slurry during printing.

However, the researches and studies made by the inventors have proved that, when such a conductive paste is merely printed on a semiconductor substrate of a solar cell and then fired to provide the desired electrodes, a barrier tends to be formed between each of the electrodes and the semiconductor substrate resulting in difficulty of ensuring the desired satisfactory ohmic contact as well as the desired low contact resistance.

In order to form the electrodes on a photovoltaic semiconductor substrate of, for example, n-type silicon by the use of such a conductive paste thereby providing a satisfactorily usable solar cell, it has been required that the impurity concentration at the silicon substrate surfaces to be formed with the electrodes, that is, at both the major surface diffused or doped with a p-type impurity to form a pn junction and the other non-doped major surface, be higher than $10^{19}$ cm$^{-3}$ so that a p$^+$-type layer and an n$^+$-type layer can be formed in such surfaces respectively. It has also been required that the conductive paste layers printed on the substrate surfaces be fired at a relatively high temperature higher than 800° C.

Another problem arises due to the firing treatment at such a high firing temperature. When, for example, boron is diffused into one of the major surfaces of the n-type silicon substrate to form a photovoltaic p$^+$-type diffused layer defining a p$^+$/n junction within the substrate, the electrode formed on the photovoltaic p$^+$-type diffused layer which is to be irradiated with the solar radiation in use may penetrate through this p$^+$-type diffused layer, tending to destroy the p$^+$/n junction exhibiting the photovoltaic characteristic.

Thus, extreme difficulty has been encountered when such a prior art conductive paste of Ag or Ag/Pd is used to form the electrodes of the solar cell in satisfying the important requirements including the low contact resistance and no penetration of the electrode through the photovoltaic diffused layer. The prior art conductive paste of Au has had a problem similar to that encountered with the use of the prior art conductive pastes of Ag or Ag/Pd above described. In addition, in the case of the prior art conductive paste of Au, it has been more difficult to provide an inexpensive solar cell due to the fact that the cost of this conductive paste is about ten or more times higher than that of Ag.

A suitable amount of a powdery vitreous material acting as a binder for the powders of the metal or metals is generally added to each of these conductive pastes so that the electrodes having been subjected to the firing treatment can be firmly and stably bonded to the semiconductor substrate.

The composition of such a powdery vitreous material varies generally depending on the kind of the metal component or components and also on the firing temperature. In the case of a conductive paste of Ag which is usually fired at a medium firing temperature of about 550° C., the binder contains powdery low-melting glass of PbO as its principal component. On the other hand, in the case of a conductive paste of Ag which is usually fired at a firing temperature higher than 800° C., the binder contains powdery borosilicate-lead glass as its principal component. Thus, the powdery vitreous material in the prior art conductive pastes contains a large amount of lead glass although these conductive pastes have different compositions and are fired at different firing temperatures. The presence of this lead glass in the conductive paste obstructs deposition of the electrodes making satisfactory direct ohmic contact with the semiconductor substrate of, for example, silicon. Such an obstruction occurs because the lead glass component in the vitreous binder has the tendency of promoting oxidation of the semiconductor substrate of, for example, silicon, during the step of firing of the conductive paste, and the oxide film thus formed on the semiconductor substrate intervenes between each of the electrodes and the associated substrate surface, resulting in a high contact resistance. Thus, a firing temperature higher than 800° C. has heretofore been required in order to break the oxide film causing the high contact resistance, thereby ensuring satisfactory ohmic contact of the metal component in the paste with the semiconductor substrate.

It will be understood from the above discussion that these conductive pastes used hitherto for forming the electrodes of thick-film resistors and capacitors have not been satisfactorily usable as the electrode material for photoelectric conversion devices such as solar cells. It has therefore been difficult to provide solar cells having a high conversion efficiency by the use of these prior art conductive pastes as the electrode material therefor.

SUMMARY OF THE INVENTION

It is a primary object of the present invention to provide a photoelectric conversion device, especially a solar cell having a high conversion efficiency and having its electrodes formed by screen printing a conductive paste on a semiconductor substrate so that such a photoelectric conversion device can be easily manufactured at a low cost.

In the present invention, a novel conductive paste which obviates the defects of the prior art conductive pastes is used, and the merits of the screen printing technique are fully utilized, so that the electrodes of a photoelectric conversion device of relatively large size such as a solar cell having a high conversion efficiency can be formed easily at a low cost.

More precisely, the present invention provides a novel conductive paste which is superior to the Ag-Al and Ag-Au systems already proposed by the inventors and disclosed in U.S. patent application Ser. No. 927,334 so as to further improve the performance of a photoelectric conversion device such as a solar cell by forming its electrodes from such a novel conductive paste.

The novel conductive paste used in the present invention contains silver (Ag) and gold (Au) in powder form as its principal solid components, and a metal such as aluminum (Al) or antimony (Sb) in powder form or an intermetallic compound of such a metal in powder form having a eutectic temperature lower than that of Ag when alloyed with a semiconductor such as silicon, is added as another solid component to the mixture of Ag and Au powders to provide a ternary mixture of such solid components. The conductive paste further contains a powdery vitreous material preferably not containing any lead glass component therein. In an embodiment of the present invention, this conductive paste is coated by the screen printing technique on the major surfaces of a photovoltaic semiconductor substrate for a solar cell, for example, an n-type silicon substrate having a p+-type diffused layer and an n+-type diffused layer formed in its major surfaces respectively, and the silicon substrate coated with the conductive paste layers is then subjected to firing treatment in an inert gas atmosphere such as a stream of nitrogen gas containing a very small amount of oxygen, so as to manufacture a solar cell having a high conversion efficiency in a simple manner and at a low cost.

Al or Sb in powder form is an especially preferred and effective metal component to be mixed with Ag and Au in powder form which are the principal metal or solid components of the conductive paste used in the present invention. The powdery glass material contained in the conductive paste is preferably such that the entirety of powdery glass of lead compound is replaced by a powdery glass of zinc compound. The conductive paste providing the electrodes of the solar cell according to the present invention need not be fired at a firing temperature higher than 800° C., unlike the prior art conductive pastes and can be fired at a considerably lower firing temperature of about 600° C.

In the present invention, removal of the organic component such as ethyl cellulose by oxidation in the firing step is preferably carried out in an inert gas atmosphere containing oxygen in an amount smaller than 1% by volume. The removal of the organic component under the above condition is advantageous in that the metal components in powder form are not substantially oxidized so that the electrodes thus formed have a low contact resistance desirable for the solar cell.

Thus, it is an important feature of the present invention that any glass component of lead compound is not contained in the powdery vitreous material so that the semiconductor substrate may not be oxidized in an accelerated fashion in spite of the fact that the conductive paste coated on the semiconductor substrate is subjected to the firing treatment in an inert gas atmosphere containing a small amount of oxygen. It is another important feature of the present invention that a metal such as Al or Sb in addition to Ag and Au is added as another solid component so that the electrodes can make satisfactory ohmic contact with the semiconductor substrate in spite of firing at a relatively low firing temperature.

For example, a firing temperature higher than 800° C., close to the eutectic temperature of an alloy of silicon and silver as described hereinbefore, has heretofore been required to ensure satisfactory ohmic contact between a semiconductor substrate of silicon and electrodes formed from a conductive paste of Ag. However, when metals such as Au and Al or Sb having a eutectic temperature lower than that of Ag when alloyed with silicon are added to Ag, the electrodes formed from such a conductive paste can make satisfactory ohmic contact with the silicon substrate in spite of firing at a firing temperature considerably lower than 800° C. Further, when the composition percentages of these metals added to Ag and the firing conditions of the conductive paste are suitably selected, the electrodes thus formed would not penetrate through the relatively shallow diffused layers formed in the semiconductor substrate as that of, for example, the solar cell.

In the present invention, the metals such as Au and Al or Sb having an eutectic temperature lower than that of Ag when alloyed with silicon are added to Ag in the form of ultrafine particles having a primary particle size smaller than 0.5 μm. Since such ultrafine particles have an inherent tendency of easily forming a slurry when dispersed in a solvent, the electrodes making satisfactory ohmic contact with the semiconductor substrate can be formed at a lowered firing temperature. Further, when the composition percentages of these metals added to Ag, and the firing conditions of the conductive paste are suitably selected, the electrodes thus formed will not penetrate through the relatively shallow diffused layers formed in the semiconductor substrate as that of, for example, the solar cell.

In another embodiment of the present invention, a semiconductor substrate of, for example, silicon having a diffused layer formed in one of its major surfaces and having no diffused layer in the other major surface is prepared. In order to fully effectively utilize the merits of the screen printing technique, a metal capable of exhibiting the effect of increasing the surface impurity concentration is deposited on the non-doped major surface of the semiconductor substrate by a suitable plating technique, and the same conductive paste as that coated by the screen printing technique on the doped major surface of the substrate is also coated on the non-doped and metal-plated major surface of the substrate. Subsequently, the conductive paste layer coated on the doped major surface and that coated on the non-doped and metal-plated major surface of the substrate are fired at the same time by a single firing treatment to form the desired electrodes making ohmic contact with the substrate.

The metal which can be deposited on the non-doped major surface of the substrate by a relatively simple process to permit the ohmic contact between that major surface of the substrate and the associated electrode is, for example, nickel (Ni), and the process of deposition is, for example, electroless plating. This electroless plating is as economical as the impurity diffusion described hereinbefore.

Thus, in another preferred embodiment of the present invention, a semiconductor substrate for a photoelectric conversion device of relatively large size such as a solar cell having a wide active area may have a diffused layer formed in one of its major surfaces and a film of Ni previously deposited by the electroless plating technique on the other major surface, and the conductive paste layer coated on the doped major surface and that coated on the Ni-plated major surface of the substrate may be fired at the same time to form the electrodes of the solar cell by a single firing treatment.

The above and other objects, features and advantages of the present invention will become more apparent from the following detailed description of preferred embodiments thereof taken in conjunction with the accompanying drawings in which:

DESCRIPTION OF THE PREFERRED EMBODIMENTS

Preferred embodiments of the solar cell according to the present invention will now be described in further detail.

EMBODIMENT 1

Figure 1A:
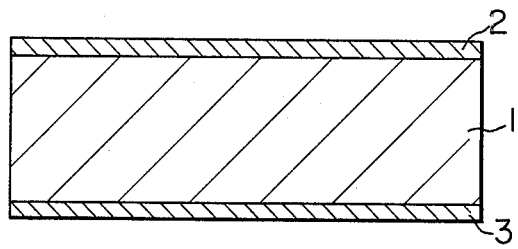
FIGS. 1A, 1B and 1C are schematic sectional views showing successive steps of a process for the manufacture of a preferred embodiment of the solar cell according to the present invention.
Figure 1B:
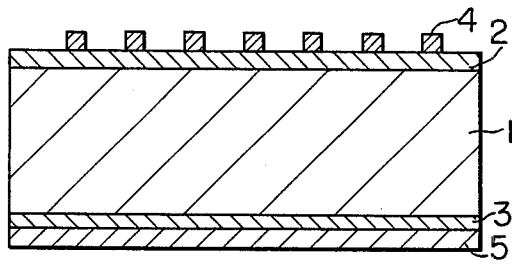
Figure 1C:
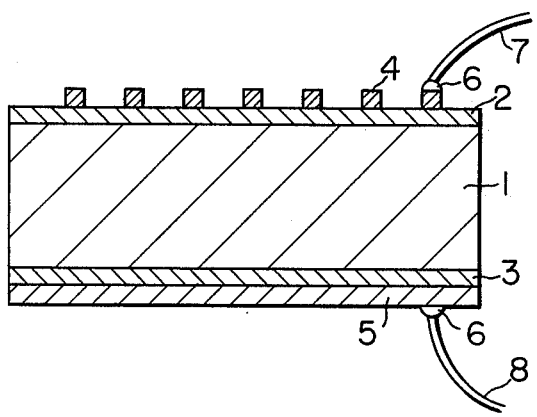

10 grams of ultrafine particles of silver (Ag) having a particle size smaller than 0.5 μm, 1 gram of ultrafine particles of gold (Au) having a particle size smaller than 0.1 μm, and 0.5 grams of ultrafine particles of aluminum (Al) having a particle size smaller than 0.1 μm were thoroughly mixed and agitated, together with 0.5 grams of a powdery glass material of zinc oxide-boron oxide-silicon dioxide ($ZnO-B_2O_3-SiO_2$) containing ZnO as its principal component and having a particle size smaller than 1 μm, in a mill of agate while adding small amounts of ethyl cellulose and carbitol thereto, to prepare a viscous slurry or a so-called ternary conductive paste of Ag-Au-Al having a viscosity of about 300 cps. A substrate 1 of n-type silicon having a resistivity of 1 Ω-cm was furnished as a substrate of a solar cell. A spin-on borosilicate film was deposited on one of the major surfaces of the substrate 1, and boron was diffused at a temperature of 1,050° C. to form a p+-type diffused layer 2 having a thickness smaller than about 0.8 μm, as shown in FIG. 1A. A spin-on phosphosilicate film was deposited on the other major surface of the substrate 1, and phosphorus was diffused at a temperature of 900° C. to form an n+-type diffused layer 3 having a thickness smaller than about 0.8 μm, as also shown in FIG. 1A. The conductive paste of the aforementioned composition was then printed on the surfaces of the diffused layers 2 and 3 using a 250-mesh stencil screen. After drying the substrate 1 in a hot air oven at a temperature of 120° C. to remove the organic solvent by evaporation, the substrate 1 was subjected to a firing treatment at a firing temperature of 550° C. in an inert gas atmosphere of a stream of nitrogen gas containing a very small amount of oxygen to form an electrode 4 of grid pattern on the surface of the p+-type diffused layer 2 toward which the solar radiation is to be directed and also to form an electrode 5 of strip pattern on the entire surface of the n+-type diffused layer 3, as shown in FIG. 1B. Subsequently, electrode lead wires 7 and 8 were connected by beads of solder 6 to the respective electrodes 4 and 5 to provide a solar cell as shown in FIG. 1C. Radiation from a solar simulator AMO (140 mW/cm²) was directed toward the solar cell thus obtained to measure the output characteristics of the solar cell model. The results of the measurement indicated that the solar cell provided an open-circuit voltage Voc of 0.63 V and a short-circuit current Isc of 650 mA as shown by the solid curve a in FIG. 2. The fill factor F F was 75%, and the maximum power Pmax was 307 mW. The conversion efficiency $\zeta$ at the active area of the solar cell model having the output characteristics above specified was 12.0%. The performance of this solar cell model was thus greater than that of the solar cell proposed previously by the inventors in which a binary system conductive paste was used.

EMBODIMENT 2

In Embodiment 1, the conductive paste containing the ternary mixture of ultrafine particles of metals was used to form the electrodes 4 and 5 on the surfaces of the p+-type diffused layer 2 and n+-type diffused layer 3 respectively. Embodiment 2 differs from Embodiment 1 in that nickel (Ni) is previously deposited by the electroless plating technique on one of the major surfaces of the silicon substrate 1 to replace the n+-type diffused layer 3. The conductive paste containing the aforementioned ternary mixture of ultrafine particles of metals (Ag, Au and Al) was also used to form the electrodes on the surface of the p+-type diffused layer 2, and on the surface of the nickel plated layer.

The slurry or conductive paste used in Embodiment 2 was the same in composition as that prepared in Embodiment 1. A spin-on borosilicate film was coated on one of the major surfaces of a substrate 1 of n-type silicon having a resistivity of 1 $\Omega$-cm, and boron was diffused at a temperature of 1,050° C. to form a p+-type diffused layer in that major surface of the silicon substrate 1. The p+-type layer on the other major surface of the silicon substrate (the major surface opposite to the major surface coated with the spin-on borosilicate film) was etched away to expose the surface of the silicon substrate 1. Then, a film of Ni about 1 $\mu$m thick was deposited by the electroless plating technique on the exposed major surface of the silicon substrate 1. For the purpose of electroless Ni plating, a plating solution containing 16 grams of nickel chloride, 27 grams of ammonium chloride, 2 grams of citric acid, 12 grams of sodium hypophosphite and 7 grams of sodium ethylenediaminetetraacetate dissolved in 750 ml of pure water was used, and its pH value was adjusted to 9.2 to 9.6 with ammonia water. The Ni plating was carried out for about 40 seconds at a temperature of 85° C. Subsequently, the conductive paste of the aforementioned composition was printed on the surface of the p+-type diffused layer and on the Ni-plated surface of the silicon substrate using a 250-mesh stencil screen. After drying the substrate in a hot air oven at a temperature of 120° C. to remove the organic solvent by evaporation, the substrate was fired at a temperature of 570° C. in an atmosphere of a stream of nitrogen gas containing a very small amount of oxygen to provide a solar cell.

Figure 2:
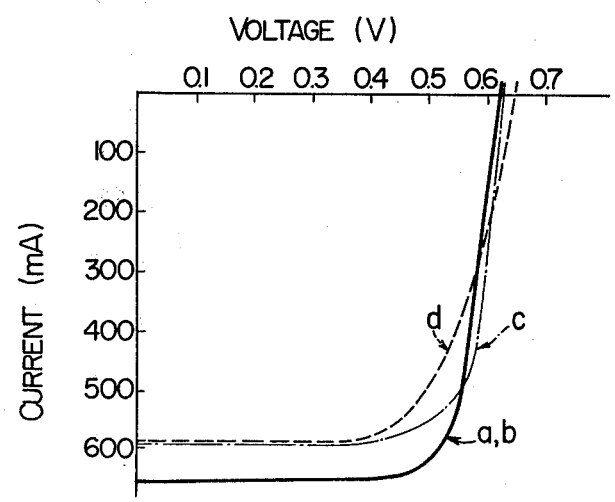
FIG. 2 is a graph illustrating the output characteristics of the solar cell shown in FIG. 1 as compared with those of prior art solar cells.

The output characteristics of the solar cell model thus obtained was measured in a manner similar to that described in Embodiment 1. The solid curve b shown in FIG. 2 represents the voltage-current characteristic of the solar cell model, and the values of Voc, Isc, F F, Pmax and $\zeta$ were entirely the same as those in Embodiment 1. For comparison purposes, a conductive paste of Ag-Au similar to that proposed previously by the inventors, that is, a conductive paste containing, as its principal components, 10 grams of Ag and 1.5 grams of Au and processed under the same conditions as those used for the preparation of the ternary mixture system described with reference to Embodiment 1, was prepared to form the electrodes of a first reference solar cell. Similarly, a conductive paste of Ag-Al that is, a conductive paste containing, as its principal components, 10 grams of Ag and 1.0 gram of Al and processed under the same conditions as those used for the preparation of the ternary mixture system described with reference to Embodiment 1, was prepared to form the electrodes of a second reference solar cell. The one-dot chain curve c and the broken curve d in FIG. 2 represent the voltage-current characteristics of these reference solar cells respectively. It will be seen from the curve c that Voc=0.64 V, Isc=580 mA, F F=74%, Pmax=275 mW and $\zeta$=10.5% in the case of the first reference solar cell, and it will also be seen from the curve d that Voc=0.63 V, Isc=580 mA, F F=72%, Pmax=263 mW and $\zeta$=10.5% in the case of the second reference solar cell. It is readily apparent from comparison between curve b and curves c, d that the solar cell according to Embodiment 2 of the present invention is improved over the prior art solar cells manufactured as references for comparison purposes.

In order to clarify the reason why a solar cell having a such high conversion efficiency as above described could be obtained according to the present invention, the inventors conducted an experiment in which a pair of opposite electrodes were formed on each of the major surfaces of the substrate 1 of the solar cell for the purpose of measurement of the contact resistance between the electrode 4 and the substrate 1 as well as the sheet resistance of the electrode 4 having an important relationship with the output characteristics and also for the purpose of measurement of the leakage current on which the fill factor F F, hence, the maximum power Pmax is dependent. The results of measurements proved that the contact resistance between the electrode 4 and the substrate 1 of the solar cell was as low as about $1 \times 10^{-3} - 10^{-4}$ $\Omega$-cm$^2$, and also the sheet resistance of the electrode 4 was sufficiently low or about $3 \times 10^{-3}$ $\Omega$/sq. The degree of penetration of the electrode 4 through the p+-type diffused layer 2 is represented by the value of the so-called leakage current appearing when a negative voltage or a reverse bias voltage is applied to the electrode 4 deposited on the p+-type diffused layer 2. This leakage current was also sufficiently small or about $2.5 \times 10^{-6}$ A/cm$^2$, and any appreciable penetration of the electrode 4 through the p+-type diffused layer 2 was not observed.

In Embodiments 1 and 2, the conductive paste of Ag-Au-Al was used to form the electrode 5 on the surface of the n+-type diffused layer 3 of the substrate 1 or on the Ni-plated surface of the substrate 1. However, a conductive paste of Ag-Au or Ag-Al as disclosed in our U.S. Patent Application Ser. No. 927,334 may be applied to such a surface without giving rise to any problem. In such a case, the firing temperature for the conductive paste layer coated on the surface of the n+-type diffused layer 3 in the substrate 1 or on the Ni-plated surface of the substrate 1 is preferably the same as that for the conductive paste layer coated on the surface of the p+-type diffused layer 2 in the substrate 1.

EMBODIMENT 3

In Embodiments 1 and 2, the firing temperature for the conductive paste providing the electrodes was selected to lie within a most suitable range including 550° C. and 570° C. It is important that the firing temperature be set at about 570° C. for provision of the solar cell according to the present invention.

Figure 3:
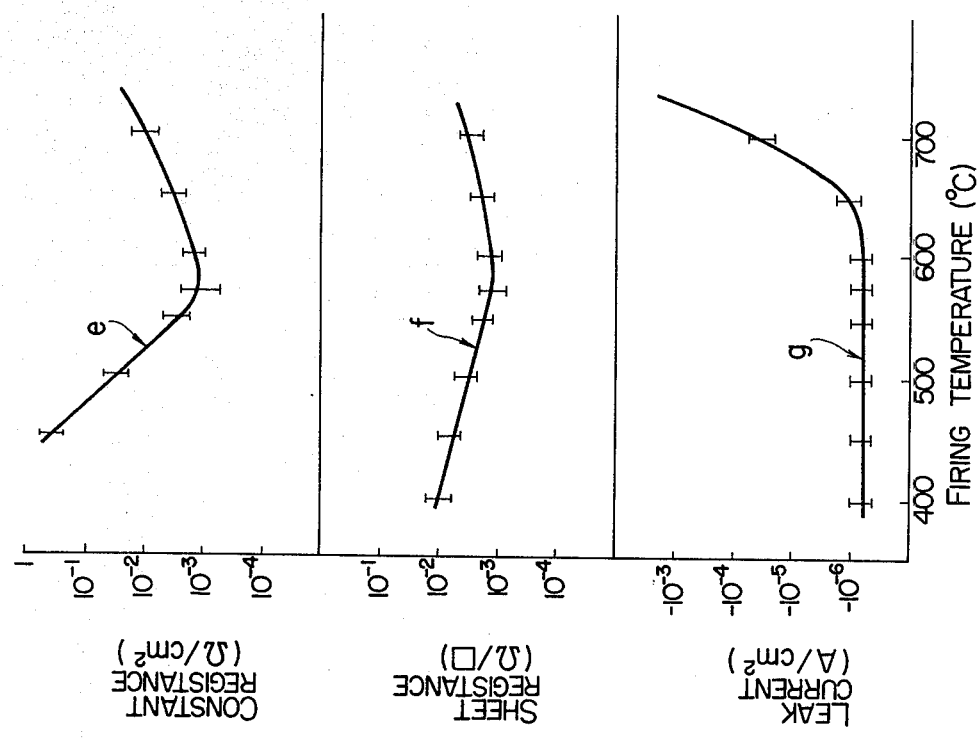
FIG. 3 shows the variations in the contact resistance, the electrode's sheet resistance and the leakage current relative to the firing temperature in the solar cell shown in FIG. 1.

Solar cells were made under the same conditions as those described with reference to Embodiment 1, except the firing temperature, using the same conductive paste as that described with reference to Embodiment 1. FIG. 3 shows the relation between the firing temperature and the contact resistance between the electrode 4 and the surface of the $p^+$-type diffused layer 2 in the substrate 1 of the solar cells, the relation between the firing temperature and the sheet resistance of the electrode 4, and the relation between the firing temperature and the leakage current exhibiting the presence or absence of penetration of the electrode 4 through the $p^+$-type diffused layer 2. The substrates 1 were subjected to firing treatment for 10 minutes at various firing temperatures in an atmosphere of nitrogen gas containing a very small amount of oxygen and flowing at a flow rate of 1 l/min. It will be seen from the curve e that the contact resistance is lowest at a firing temperature in the vicinity of 570° C. and increases on opposite sides of this point. The contact resistance between the electrode 4 and the surface of the $p^+$ type diffused layer 2 in the substrate 1 of the solar cell should be lower than $1 \times 10^{-2}$ $\Omega\text{-cm}^2$, and the present invention satisfies this requirement since the firing temperature for the conductive paste is selected to be higher than at least 550° C. The sheet resistance of the electrode 4 is dependent upon the composition percentages of the metals in the conductive paste and also upon the amount or percentage of powdery glass added thereto. When the conductive paste has the composition according to the present invention, that is, when the conductive paste contains the aforementioned mixture of Ag, Au and Al in powder form and further contains less than 10% by weight of powdery glass, the sheet resistance of the electrode 4 is lowest at a firing temperature in the vicinity of 570° C. as seen from the curve f. This is because the effect of firing on the powdery glass is not sufficient at temperatures lower than about 570° C., and also because Al in the ternary mixture of the metals is oxidized by the oxygen present in the firing atmosphere when the firing temperature is higher than about 570° C. Another important factor for the solar cell is that the contact resistance between the electrode 4 and the surface of the $p^+$-type diffused layer 2 must be sufficiently low as described hereinbefore and the electrode 4 having the low sheet resistance must be formed in such a manner that there is no penetration of the electrode 4 through the $p^+$-type diffused layer 2. The curve g shows the relation between the firing temperature and the leakage current which is indicative of the degree of penetration of the electrode 4 through the $p^+$-type diffused layer 2 and appears when a negative voltage or a reverse bias voltage is applied to the electrode 4 deposited on the $p^+$-type diffused layer 2. It will be seen from the curve g that no penetration whatsoever occurs at firing temperatures lower than 650° C.

It can be concluded from the above discussion that the firing temperature range most preferable for the manufacture of the solar cell according to the present invention is between 550° C. and 650° C.

EMBODIMENT 4

Ten conductive pastes of Ag-Au-Al according to the present invention but having respectively different composition percentages of the solid components, Ag, Au, Al and glass in powder form, were prepared to investigate the effect of the conductive paste composition on the electrical properties including the contact resistance between the electrode 4 and the surface of the $p^+$-type diffused layer 2, the sheet resistance of the electrode 4 and the leakage current indicative of the degree of penetration of the electrode 4 through the $p^+$-type diffused layer 2.

Each of these conductive pastes was used to form the electrodes 4 and 5 on a silicon photovoltaic substrate 1 having a $p^+/n$ junction. Table 1 shows the contact resistance between the electrode 4 and the surface of the $p^+$-type diffused layer 2, the sheet resistance of the electrode 4 and the leakage current measured on the solar cells thus obtained. The steps of preparation, printing and firing of each conductive paste was basically the same as those described with reference to Embodiment 1. However, each of these conductive pastes was actually prepared by initially preparing a conductive paste composition containing Ag and glass in powder form, adding suitable amounts of Au and Al in powder form to this conductive paste composition, and thoroughly mixing and agitating the resultant mixture while supplying a suitable amount of carbitol again to adjust the viscosity to about 300 cps.

TABLE 1

| Paste No. | Ag Amount Percentage (g) (wt. %) | Au Amount Percentage | Al Amount Percentage | Glass Amount Percentage | Contact resistance | Sheet resistance ($\Omega$-/sq) | Leakage current (A/cm$^3$) |
|---|---|---|---|---|---|---|---|
| *1 | 10.0 | 0 | 0 | 1.0 | $10^{(\Omega\text{-}cm2)}$ | $3 \times 10^{-3} >$ | $2.5 \times 10^{-6}$ |
|    | 90.9 | 0 | 0 | 9.1 | | | |
| 2  | 10.0 | 0.1 | 0.1 | 1.0 | $10^{-2} \sim 10^{-3}$ | $3 \times 10^{-3} >$ | $2.5 \times 10^{-6}$ |
|    | 89.3 | 0.9 | 0.9 | 8.9 | | | |
| 3  | 10.0 | 0.2 | 0.2 | 1.0 | $10^{-2} \sim 10^{-3}$ | $3 \times 10^{-3} >$ | $2.5 \times 10^{-6}$ |
|    | 87.7 | 1.8 | 1.8 | 8.8 | | | |
| 4  | 10.0 | 0.3 | 0.3 | 1.0 | $10^{-3} \sim 10^{-4}$ | $3 \times 10^{-3} >$ | $2.5 \times 10^{-6}$ |
|    | 88.2 | 2.6 | 2.6 | 8.6 | | | |
| 5  | 10.0 | 0.5 | 0.5 | 1.0 | $10^{-3} \sim 10^{-4}$ | $5 \times 10^{-3} >$ | $2.5 \times 10^{-6}$ |
|    | 83.3 | 4.2 | 4.2 | 8.3 | | | |
| 6  | 10.0 | 1.0 | 1.0 | 1.0 | $10^{-3} \sim 10^{-4}$ | $7 \times 10^{-3} >$ | $2.5 \times 10^{-6}$ |
|    | 76.9 | 7.7 | 7.7 | 7.7 | | | |
| 7  | 10.0 | 1.3 | 1.3 | 1.0 | $10^{-3} \sim 10^{-4}$ | $8 \times 10^{-3} >$ | $5 \times 10^{-6}$ |
|    | 73.6 | 9.5 | 9.5 | 7.3 | | | |
| 8  | 10.0 | 1.5 | 1.5 | 1.0 | $10^{-3} \sim 10^{-4}$ | $1 \times 10^{-3} >$ | $8 \times 10^{-6}$ |
|    | 71.4 | 10.7 | 10.7 | 7.1 | | | |
| 9  | 10.0 | 1.8 | 1.8 | 1.0 | $10^{-3} \sim 10^{-4}$ | $5 \times 10^{-2} >$ | $1 \times 10^{-5}$ |
|    | 68.5 | 12.3 | 12.3 | 6.9 | | | |

TABLE 1-continued

| Paste No. | Ag Amount Percentage | Au Amount Percentage | Al Amount Percentage | Glass Amount Percentage | Contact resistance | Sheet resistance ($\Omega$-/sq) | Leakage current (A/cm$^3$) |
| --- | --- | --- | --- | --- | --- | --- | --- |
| 10 | 10.0 | 2.0 | 2.0 | 1.0 | $10^{-3} \sim 10^{-4}$ | $5 \times 10^{-2} >$ | $1 \times 10^{-5}$ |
|  | 66.7 | 13.3 | 13.3 | 6.7 |  |  |  |

It will be apparent from Table 1 that preferred composition percentages of the effective solid components of the conductive paste of Ag-Au-Al according to the present invention are 70–90% by weight of Ag, 1–11% by weight of Au, 1–11% by weight of Al and 7–9% by weight of glass. Deviation of the composition percentages of the solid components from the values above specified will greatly deteriorate the performance of the solar cell due to the fact that the contact resistance, electrode sheet resistance and leakage current are all degraded. Especially important in the composition percentages of the solid components of the conductive paste of Ag-Au-Al according to the present invention is that the total amount of the metal components Au and Al added to the principal component, Ag, is smaller than the amount of Au in the prior art conductive paste of Ag-Au system or the amount of Al in the prior art conductive paste of Ag-Al. More precisely, in the case of the conductive paste of Ag-Al disclosed in Ser. No. 927,334, at least 5% by weight of Al had to be added to Ag. Similarly, in the case of the prior art conductive paste of Ag-Au, at least 5% by weight of Au was required. In contrast, in the case of the ternary conductive paste of Ag-Au-Al according to the present invention, Au and Al each in an amount not smaller than 1% by weight are merely required so that the electrodes of the solar cell can be fully effective in exhibiting the desired effect of photoelectric conversion.

The advantage of the small amount or percentage of Au and Al in the ternary conductive paste according to the present invention will now be described. The reduced amount of Al permits succesful deposition of the electrodes and is effective in reducing the resistivity of the electrodes since Al is more susceptible to oxidation than Au and Ag. Further, the specific resistance of Ag is 1.59 $\mu\Omega$/cm, whereas those of Au and Al are 2.44 $\mu\Omega$/cm and 2.66 $\mu\Omega$/cm respectively. Thus, the specific resistance of Ag is considerably lower than those of Au and Al. In the ternary conductive paste of Ag-Au-Al according to the present invention, therefore, the amount of Au-Al can be reduced to reduce the resistivity of the electrodes formed by the conductive paste of Ag-Au-Al. When the conductive paste of the present invention having a most preferred composition is applied to form an electrode 4 on a photovoltaic silicon substrate 1 having the shallowest possible p$^+$-type diffused layer 2 for exhibiting the highest possible conversion efficiency, the contact resistance is $1 \times 10^{-3} - 10^{-4}$ $\Omega$-cm$^2$, the electrode sheet resistance is lower than $1 \times 10^{-3}$ $\Omega$/sq and the leakage current is about $2.5 \times 10^{-6}$ A/cm$^2$. These electrical properties of electrode 4 are very preferable for achieving the desired performance of the solar cell, and a conversion efficiency higher than 11% can be easily exhibited in response to the radiation from the AMO solar simulator.

Figure 4:
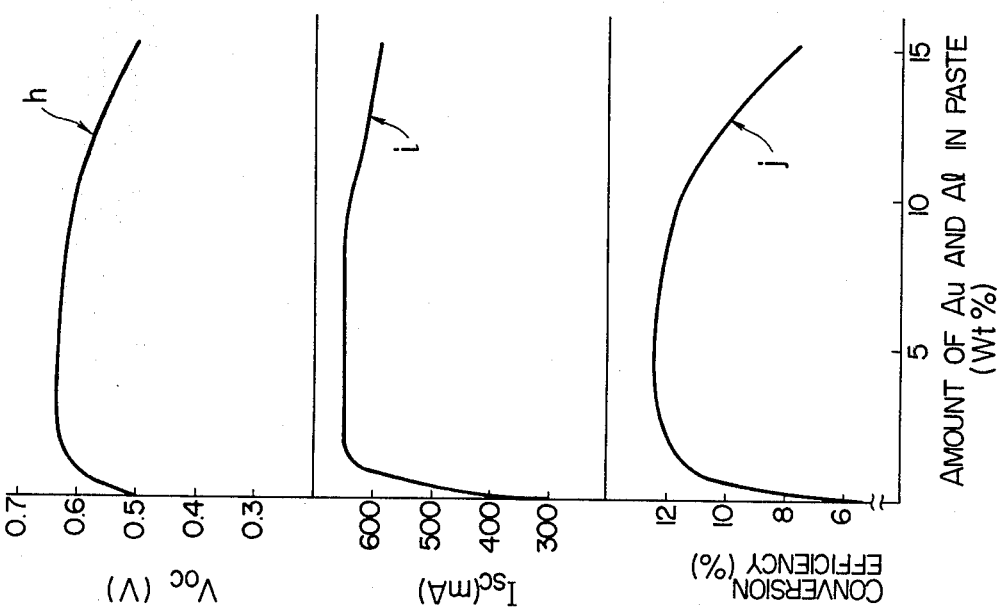
FIG. 4 shows the variations in the open-circuit voltage, the short-circuit current and the conversion efficiency relative to the total amount of Au and Al in the conductive paste used to form the electrodes of the solar cell shown in FIG. 1.

FIG. 4 shows the variations in the open-circuit voltage Voc, the short-circuit current Isc, and the conversion efficiency $\zeta$ of the solar cell relative to the total amount in percent by weight of Au and Al in the conductive paste described in Exhibit 1. In FIG. 4, the curves h, i and j represent the open-circuit voltage Voc, the short-circuit current Isc, and the conversion efficiency $\zeta$, respectively, relative to the total amount in percent by weight of Au and Al in the conductive paste. The condition of formation of the p$^+$-type diffused layer 2 in the silicon substrate and the steps of preparation, printing and firing of the conductive paste are basically the same as those described with reference to Embodiment 1. A plurality of such conductive pastes were prepared in which the total amount of Au and Al was varied while maintaining the ratio between the percent by weight of Au in powder form and that of Al in powder form at 2:1. Each of these conductive pastes was prepared by initially preparing a conductive paste composition not containing Au, adding a suitable amount of Au in powder form to this conductive paste composition, and thoroughly mixing and agitating the resultant mixture while supplying a suitable amount of carbitol again to adjust the viscosity to about 300 cps.

It will be seen from FIG. 4 that, when the conductive paste containing Ag in powder form as its sole metal component without containing Au and Al is used to form the electrode 4, the values of Voc and Isc of the solar cell are small (0.5 V and 300 mA respectively), resulting in a conversion efficiency as low as 1.6%. This is attributable to the fact that the contact resistance is 10 $\Omega$-cm$^2$ which is considerably high. In contrast, when the conductive paste, in which only 1.0% by weight of Au and 1.0% by weight of Al are added to the above composition, is used to form the electrode 4, the contact resistance is greatly reduced to greatly increase the values of Voc and Isc. The conversion efficiency of the solar cell increases until the total amount of Au and Al in the composition attains 5.0% by weight, due to the fact that the contact resistance is correspondingly decreased. With a further increase in the total amount of Au and Al in the composition, Au and Al will finally penetrate through the p$^{30}$-type diffused layer 2 to increase the leak current thereby decreasing the values of the fill factor F F and open-circuit voltage Voc, resulting in a lowered conversion efficiency. It is therefore desirable that the contact resistance and the sheet resistance be sufficiently low and the leakage current be small in order that the solar cell having electrode 4 formed by the conductive paste of Ag-Au-Al can exhibit a high conversion efficiency. The percentage of Au and Al substantially satisfying these three conditions was 1–10% by weight of the solid components. The most preferred percentage of the total amount of Au and Al was 2–7% by weight, and in this range, the contact resistance, sheet resistance, and leakage current were $1 \times 10^{-3} - 10^{-4}$ $\Omega$-cm$^2$, $7 \times 10^{-4}$ $\Omega$/sq. and $2.5 \times 10^{-6}$ A/cm$^2$ respectively. The conductive paste containing less than 1% by weight of Au and less than 1% by weight of Al provided a contact resistance of 1 $\Omega$-cm$^2$ and was thus not suitable for use to form the electrode 4 of the solar cell.

Embodiment 5

The glass, being one of the solid components of the conductive paste according to the present invention, will now be discussed. The glass in the conductive paste described in each of the aforementioned embodiments was a powdery glass material of $ZnO$-$B_2O_3$-$SiO_2$ which did not contain PbO or similar lead compound and in which ZnO in powder form was the principal component. For the purpose of comparison, a conductive paste having the greater part of ZnO, the principal component of the powdery glass material, replaced by PbO was prepared by a method similar to that described with reference to Embodiment 1. In this case, the powdery glass material in the conductive paste comprised a 1:3 mixture of powdery glass of $ZnO$-$B_2O_3$-$SiO_2$ and powdery glass of $PbO$-$B_2O_3$-$SiO_2$. When this conductive paste was used to form the electrodes 4 and 5 of the solar cell, the contact resistance between the electrode 4 and the $p^+$-type diffused layer 2 as well as that between the electrode 5 and the $n^+$-type diffused layer 3 was as high as 1 $\Omega$-$cm^2$. That is, this value was one hundred or more times as high as that of the electrodes formed by the conductive paste not containing PbO as described in Embodiment 1. Further, when the entirety of ZnO in the conductive paste was replaced by PbO, that is, when the conductive paste contained powdery glass of $PbO$-$B_2O_3$-$SiO_2$ instead of the $ZnO$-$B_2O_3$-$SiO_2$, the contact resistance was as high as 3 $\Omega$-$cm^2$, and the electrodes formed by such a conductive paste could not be practically used for the solar cell.

For the reasons above described, it is also important that the glass component in the conductive paste according to the present invention does not contain powdery glass of a lead compound at all, and the meritorious effects of the present invention are achieved by replacing the lead glass by the ZnO glass having a relatively low melting point. The conductive paste according to the present invention provided the results substantially similar to that above described even when it was applied to form an electrode on an n-type diffused layer formed in a p-type silicon substrate. It will be understood from the above description that the solid components of the conductive paste according to the present invention comprise a ternary powdery mixture of Ag, Au and Al and a powdery glass material preferably containing a ZnO glass as its principal component and not containing a PbO glass. Thus, the conductive paste according to the present invention exhibits an excellent performance which could not be attained by the prior art conductive pastes of Ag, Ag/Pd and Au when used to provide the electrodes of solar cells. The conductive paste according to the present invention need not be fired at an elevated temperature higher than 800° C. which has been required for firing treatment of the prior art conductive pastes of Ag and similar types, and the problems including the penetration of the electrode through the diffused layer can be substantially completely obviated. Therefore, by the use of the conductive paste according to the present invention, the screen printing technique can be applied in lieu of the vacuum evaporation technique or plating technique employed hitherto for the formation of the electrodes of solar cells, and the merits of the screen printing and firing techniques which can improve the solar cell manufacturing process can be fully exhibited, so that solar cells having a high conversion efficiency can be mass-produced at low costs. The present invention is thus very useful from the industrial point of view. Further, the present invention is also applicable to the formation of electrodes of any other photoelectric converters and light receiving elements in which an electrode thickness larger than 100 $\mu m$ is required.

Embodiment 6

Figure 5:
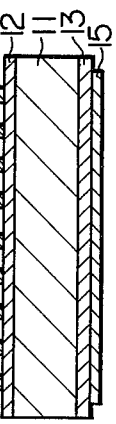
FIG. 5 is a schematic sectional view of another preferred embodiment of the solar cell according to the present invention manufactured by depositing a metal film on a non-doped major surface of a semiconductor substrate having a diffused layer in the other major surface, coating the conductive paste on both these major surfaces of the substrate, and firing the substrate to form the electrodes of the solar cell by a single firing treatment.

10 grams of ultrafine particles of silver (Ag) having a particle size smaller than 0.5 $\mu m$, 1 gram of ultrafine particles of gold (Au) having a particle size smaller than 0.1 $\mu m$, and 0.5 grams of ultrafine particles of antimony (Sb) having a particle size smaller than 0.1 $\mu m$ were thoroughly mixed and agitated, together with 0.5 grams of a glass frit of zinc oxide-boron oxide-silicon dioxide ($ZnO$-$B_2O_3$-$SiO_2$) containing zinc oxide (ZnO) as its principal component, in a mill of agate while adding small amounts of ethyl cellulose and carbitol thereto, to prepare a viscous slurry or a so-called ternary conductive paste of Ag-Au-Sb having a viscosity of about 300 cps. A semiconductor substrate 11 of p-type silicon having a diameter of 50 mm and a resistivity of 1 $\sqrt[4]{}$-cm as shown in FIG. 5 was used as a substrate of a solar cell. An $n^+$-type diffused layer 12 having a diffusion depth of about 0.8 $\mu m$ was formed in one of the major surfaces of the substrate 11, and a $p^+$-type diffused layer 13 having a suitable diffusion depth was formed in the other major surface of the substrate 11. The conductive paste of the aforementioned composition was then printed on the surfaces of the diffused layers 12 and 13 using a stencil screen to form paste layers 14 and 15 on the surfaces of the layers 12 and 13 respectively. After drying the substrate 11 in a hot air oven at a temperature of 120° C., to remove the organic solvent by vaporization, the substrate 11 was subjected to firing treatment at a firing temperature of 600° C. for 10 minutes in an atmosphere of a stream of nitrogen gas containing a very small amount of oxygen.

The contact resistances between the electrodes 14 and 15 thus formed and the surfaces of the $n^+$-type and $p^+$-type diffused layers 12 and 13 in the substrate 11 were then measured. The contact resistance between the surface of the $n^+$-type diffused layer 12 and the associated electrode 14 was $2-9 \times 10^{-4}$ $\Omega$-$cm^2$, and the contact resistance between the $p^+$-type diffused layer 13 and the associated electrode 15 was $3-7 \times 10^{-3}$ $\Omega$-$cm^2$. Thus, the former value was better than the latter value. A reverse bias voltage of $-1.0$ V was applied to the electrode 14 associated with the $n^+$-type diffused layer 12 to reverse bias the $p/n^+$ junction, and the leakage current was measured for the purpose of detecting the degree of penetration of the electrode 14, formed by the above method, through the $n^+$-type diffused layer 12. The value of the measured leakage current was $-1 \times 10^{-6}$ $A/cm^2$, and this proved that no substantial leakage occurred in the solar cell element. Thus, in spite of the fact that the conductive paste according to the present invention was fired at a temperature lower by about 200° C. than that used for the firing treatment on the prior art conductive pastes, the contact resistance was sufficiently low, and no appreciable penetration of the electrode material 14 through the $n^+$-type diffused layer 12 into the p-type substrate 11 occurred, that is, no damage to the $p/n^+$ junction was observed. The freedom from penetration of the electrode material into the substrate is most important for the performance of the solar cell. Therefore, the conductive paste according to the present invention is very useful for forming the electrodes of a solar cell.

Radiation from an AMO solar simulator (140 mW/cm$^2$) was directed toward the solar cell thus obtained to measure the output characteristics thereof. The results of measurement proved that the conversion efficiency $\zeta$ was 12%, which was equivalent to that of Embodiment 1.

Embodiment 7

Ten conductive pastes according to the present invention but having respectively different composition percentages of the solid components, Ag, Au, Sb and glass in powder form, were prepared in order to investigate the effect of the conductive paste composition on the electrical properties including the contact resistance between the electrode 14 and the n$^+$-type diffused layer 12, the sheet resistance of the electrode 14 and the leakage current indicative of the degree of penetration of the electrode 14 through the n$^+$-type diffused layer 12.

Each of these conductive pastes was used to form the electrodes 14 and 15 on a photovoltaic silicon substrate having an n$^+$/p junction. Table 2 shows the contact resistance between the electrode 14 and the surface of the n$^+$-type diffused layer 12, the sheet resistance of the electrode 14 and the leakage current measured on the solar cells thus obtained. The steps of preparing, printing and firing each conductive paste were basically the same as those described with reference to Embodiment 1. However, each of these conductive pastes was actually prepared by initially preparing a conductive paste composition containing Ag and glass in powder form, adding suitable amounts of Au and Sb in powder form to this conductive paste composition, and thoroughly mixing and agitating the resultant mixture while supplying a suitable amount of carbitol again to adjust the viscosity to about 300 cps.

resistance, electrode sheet resistance and leakage current are all degraded. Especially important in the composition percentages of the solid components of the conductive paste of Ag-Au-Sb according to the present invention is that the total amount of the metal components Au and Sb added to the principal component, Ag, is smaller than the amount of Au in the prior art conductive-paste of Ag-Au or the amount of Al in the prior art conductive paste of Ag-Al. More precisely, in the case of the conductive paste of Ag-Al disclosed in Ser. No. 927,334, at least 5% by weight of Al had to be added to Au. Similarly, in the case of the prior art conductive paste of Ag-Au, at least 5% by weight of Au was required. In contrast, in the case of the ternary conductive paste of Ag-Au-Sb according to the present invention, Au and Sb each in an amount not smaller than 1% by weight are merely required, so that the electrodes of the solar cell can be fully effective in exhibiting the desired effect.

The advantage of the small amount or percentage of Au and Sb in the ternary conductive paste will now be described. The reduced amount of Sb permits successful deposition of the electrodes and is effective in reducing the resistivity of the electrodes since Sb is more susceptible to oxidation than Au and Ag. Further, the specific resistance of Sb is 41.7 $\Omega$-cm, whereas those of Ag, Al and Au are 1.59 $\Omega$-cm, 2.66 $\Omega$-cm and 2.44 $\Omega$-cm respectively. Thus, the specific resistance of Sb is more than ten times as high as those of Ag, Al and Au. In the ternary conductive paste of Ag-Au-Sb according to the present invention, therefore, the total amount of Au and Sb can be reduced to reduce the resistivity of the electrodes formed by the conductive paste of Ag-Au-Sb. When the conductive paste of the present invention having the most preferred composition is applied to

TABLE 2

| Paste No. | Ag Amount Percentage | Au Amount Percentage | Sb Amount Percentage | Glass Amount Percentage | Contact resistance | Sheet resistance ($\Omega$/sq) | Leakage current (A/cm$^2$) |
|---|---|---|---|---|---|---|---|
| #1 | (g) 10.0 (wt. %) 90.9 | 0 0 | 0 0 | 1.0 9.1 | $10^{(\Omega\text{-}cm^2)}$ | $3 \times 10^{-3} >$ | $2.5 \times 10^{-6}$ |
| 2 | 10.0 89.3 | 0.1 0.9 | 0.1 0.9 | 1.0 8.9 | $10^{-2} \sim 10^{-3}$ | $3 \times 10^{-3} >$ | $2.5 \times 10^{-6}$ |
| 3 | 10.0 87.7 | 0.2 1.8 | 0.2 1.8 | 1.0 8.8 | $10^{-3} \sim 10^{-4}$ | $3 \times 10^{-3} >$ | $2.5 \times 10^{-6}$ |
| 4 | 10.0 86.2 | 0.3 2.6 | 0.3 2.6 | 1.0 8.6 | $10^{-3} \sim 10^{-4}$ | $3 \times 10^{-3} >$ | $2.5 \times 10^{-6}$ |
| 5 | 10.0 83.3 | 0.5 4.2 | 0.5 4.2 | 1.0 8.3 | $10^{-3} \sim 10^{-4}$ | $5 \times 10^{-3} >$ | $2.5 \times 10^{-6}$ |
| 6 | 10.0 76.9 | 1.0 7.7 | 1.0 7.7 | 1.0 7.7 | $10^{-3} \sim 10^{-4}$ | $8 \times 10^{-3} >$ | $2.5 \times 10^{-6}$ |
| 7 | 10.0 73.6 | 1.3 9.5 | 1.3 9.5 | 1.0 7.3 | $10^{-3} \sim 10^{-4}$ | $1 \times 10^{-2} >$ | $2.5 \times 10^{-6}$ |
| 8 | 10.0 71.4 | 1.5 10.7 | 1.5 10.7 | 1.0 7.1 | $10^{-3} \sim 10^{-4}$ | $2 \times 10^{-2} >$ | $5 \times 10^{-6}$ |
| 9 | 10.0 68.5 | 1.8 12.3 | 1.8 12.3 | 1.0 6.9 | $10^{-3} \sim 10^{-4}$ | $4 \times 10^{-2} >$ | $9 \times 10^{-6}$ |
| 10 | 10.0 66.7 | 2.0 13.3 | 2.0 13.3 | 1.0 6.7 | $10^{-3} \sim 10^{-4}$ | $5 \times 10^{-2} >$ | $1 \times 10^{-5}$ |

It will be apparent from Table 2 that preferred composition percentages of the effective solid components of the conductive paste of Ag-Au-Sb system according to the present invention are 77–90% by weight of Ag, 1–8% by weight of Au, 1–8% by weight of Sb, and 8–9% by weight of glass. Deviation of the composition percentages of the solid components from the values above specified will greatly deteriorate the performance of the solar cell due to the fact that the contact form an electrode 14 on a photovoltaic silicon substrate 11 having the shallowest possible n$^+$-type diffused layer 12 for exhibiting the highest possible conversion efficiency, the contact resistance is $1 \times 10^{-3} - 10^{-4}$ $\Omega$-cm$^2$, the electrode sheet resistance is lower than $1 \times 10^{-3}$ $\Omega$/sq and the leakage current is about $2.5 \times 10^{-6}$ A/cm$^2$. These electrical properties of the electrode 14 are very preferable for the desired performance of the solar cell, and a conversion efficiency higher than 11% can be easily exhibited in response to the radiation from the AMO solar simulator producing the radiation similar to the solar radiation in space.

The glass, being one of the solid components of the conductive paste in this embodiment, will now be discussed. The composition of the powdery glass material employed in each of the aforementioned embodiments comprised 60% by weight of ZnO, 10% by weight of $B_2O_3$, 10% by weight of $SiO_2$, 10% by weight of CdO, 5% by weight of $Bi_2O_3$ and 5% by weight of $Na_2O$ and did not contain PbO. For comparison purposes, a conductive paste having the greater part of ZnO, the principal component of the powdery glass material, replaced by PbO was prepared by a method similar to that described with reference to Embodiment 1. The composition of this conductive paste comprised, for example, 15% by weight of ZnO, 45% by weight of PbO, 10% by weight of $SiO_2$, 10% by weight of $B_2O_3$, 10% by weight of CdO, 5% by weight of $Bi_2O_3$ and 5% by weight of $Na_2O$. When this conductive paste was used to form the electrodes 14 and 15 of the solar cell, the contact resistance between the electrode 15 and the $p^+$-type diffused layer 13 as well as that between the electrode 14 and the $n^+$-type diffused layer 12 was as high as 1 $\Omega$-cm$^2$. That is, this value was one hundred or more times as high as that of the electrodes formed by the PbO-free conductive paste described in Embodiment 1. Further, when the entirety of ZnO in the conductive paste was replaced by PbO, the contact resistance was as high as 5 $\Omega$-cm$^2$, and this value was worse than that provided by the prior art conductive pastes.

Such an increase in the contact resistance due to the employment of a conductive paste containing powdery glass of a lead compound is considered to be attributable to the effect of lead which accelerates oxidation of the silicon substrate. More precisely, it is considered that the lead compound in the conductive paste promotes reaction between silicon and oxygen in the firing atmosphere in the course of the firing treatment on the conductive paste, and as a result, a film of silicon dioxide ($SiO_2$) having a high resistance is formed between the silicon substrate and the electrodes thereby increasing the contact resistance.

For the above reasons, it is important that the glass component in the conductive paste of Ag-Au-Sb system according to the present invention does not contain powdery glass of a lead compound at all, and the meritorious effects of the present invention are achieved by replacing the lead glass by the ZnO glass having a relatively low melting point.

Embodiment 8

The relation between the output characteristics of the solar cell and the primary particle size of the metals in the conductive paste of Ag-Au-Al or Ag-Au-Sb used for forming the electrodes of the solar cell according to the present invention will now be discussed. The metals contained in powder form in the conductive paste described in the aforementioned embodiments are ultrafine particles of Ag, Au, Al and Sb produced by a process of evaporation in a gas atmosphere and having a particle size not larger than 0.1$\mu$. In the present example, particles of Ag having a particle size five to thirty times as large as that produced by the aforementioned gaseous evaporation method were produced by adding a reducing agent such as formalin to an aqueous silver salt solution to cause precipitation of silver according to a reduction method, and after drying the precipitate, mechanically pulverizing the precipitate while adding a fatty acid thereto. Particles of Au having a particle size of 2–10$\mu$ were produced by mechanically pulverizing a piece of gold in a ball mill. The particles of Ag and Au thus obtained were used to prepare a conductive paste in a manner similar to that described with reference to Embodiment 1, and such a conductive paste was used to form electrodes on a silicon substrate for a solar cell. The solar cell thus obtained did not exhibit output characteristics suitable for practical use. By way of example, the output characteristics of this solar cell manufactured by the above process were not satisfactory because Voc=0.5 V, Isc=380 mA, FF=40% and $\zeta$=3.0%. When the contact resistance between the silicon substrate surface and the electrodes was measured in a manner similar to that described with reference to Embodiment 1, it was as high as $1 \times 10^{-1}$ $\Omega$-cm$^2$.

It has thus been found that the use of ultrafine particles of metals having a primary particle size not larger than 0.1$\mu$ is also important for the manufacture of the solar cell according to the present invention.

It will be understood from the foregoing detailed description that the present invention provides an improved photoelectric conversion device whose electrodes are formed by a novel conductive paste comprising, as its principal components, a ternary mixture of ultrafine particles of silver, gold, aluminum or antimony and a powdery glass material preferably containing powdery glass of ZnO and not containing glass of PbO. By virtue of the formation of the electrodes with such a conductive paste which obviates the various problems encountered with the prior art conductive pastes of Ag system, Ag/Pd system and Au system, the improved photoelectric conversion device according to the present invention can operate with an excellent output performance which has not been achieved hitherto. In the process for the manufacture of the photoelectric conversion device according to the present invention, ultrafine particles of metals having a particle size not larger than 0.1$\mu$ are produced as by evaporation of the metals in a gas atmosphere and are used as the metal components of the conductive paste. Therefore, an elevated firing temperature higher than 800° C. required hitherto for the firing treatment on the prior art conductive pastes of Ag and like systems is not required, and the problems including the problem of undesirable penetration of the electrode material through the photovoltaic diffused layer can be virtually obviated. In the present invention, the conductive paste is printed in lieu of being evaporated or plated unlike the prior art method, and therefore, the conductive paste can be automatically and continuously applied by a relatively inexpensive apparatus without requiring complex control means. Therefore, the present invention can remarkably improve the process for the mass production of photoelectric conversion devices requiring electrodes of relatively large active area and is thus very useful from an industrial point of view.

We claim:

1. A photoelectric conversion device comprising a semiconductor substrate of one conductivity type, an impurity diffused layer formed in one of the major surfaces of said semiconductor substrate and having a conductivity type opposite to that of said semiconductor substrate, and an electrode deposited on that substrate surface making ohmic contact with said impurity diffused layer, said electrode being formed from a mixture of materials including silver, gold and a Zn compound based glass to which aluminum or antimony is added, said glass containing no lead compound.

2. A photoelectric conversion device as claimed in claim 1, further comprising a second impurity diffused layer formed in the other major surface of said semiconductor substrate and having the same conductivity type as that of said semiconductor substrate, and a second electrode deposited on that substrate surface making ohmic contact with said second impurity diffused layer, said second electrode being formed from said mixture of materials providing said first electrode.

3. A photoelectric conversion device as claimed in claim 1, further comprising a metal film deposited on the other major surface of said semiconductor substrate, and a second electrode deposited on said metal film to make ohmic contact with said metal film, said second electrode being formed from said mixture of materials providing said first electrode.

4. A photoelectric conversion device as claimed in claim 1, wherein said electrode-providing material mixture comprises 70–90% by weight of silver, 1–11% by weight of gold, 1–11% by weight of aluminum and 7–9% by weight of said glass.

5. A photoelectric conversion device as claimed in claim 1, wherein said electrode-providing material mixture comprises 77–90% by weight of silver, 1–8% by weight of gold, 1–8% by weight of antimony and 8–9% by weight of said glass.

* * * * *